(12) United States Patent
Xiong

(10) Patent No.: US 10,310,344 B2
(45) Date of Patent: Jun. 4, 2019

(54) MEASURING METHOD AND LIQUID CRYSTAL DISPLAY PANEL

(71) Applicant: SHENZHEN CHINA STAR OPTOELECTRONICS TECHNOLOGY CO., LTD., Shenzhen (CN)

(72) Inventor: Yuan Xiong, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 14/780,252

(22) PCT Filed: Aug. 7, 2015

(86) PCT No.: PCT/CN2015/086378
§ 371 (c)(1),
(2) Date: Sep. 25, 2015

(87) PCT Pub. No.: WO2017/015987
PCT Pub. Date: Feb. 2, 2017

(65) Prior Publication Data
US 2018/0129109 A1 May 10, 2018

(30) Foreign Application Priority Data
Jul. 29, 2015 (CN) .......................... 2015 1 0455689

(51) Int. Cl.
*H01L 27/32* (2006.01)
*G02F 1/1362* (2006.01)
(Continued)

(52) U.S. Cl.
CPC ...... *G02F 1/136286* (2013.01); *G02F 1/1309* (2013.01); *G02F 1/1368* (2013.01);
(Continued)

(58) Field of Classification Search
None
See application file for complete search history.

(56) References Cited

U.S. PATENT DOCUMENTS 6,380,591 B1 * 4/2002 Kawano ............ G02F 1/136204
257/355
8,928,826 B2 * 1/2015 Zhang ................... H01L 27/124
349/40
(Continued)

FOREIGN PATENT DOCUMENTS

CN 101359671 A 2/2009
CN 101556382 A 10/2009
(Continued)

*Primary Examiner* — Chandra Chaudhari
(74) *Attorney, Agent, or Firm* — Mark M. Friedman (57) ABSTRACT

A measuring method and a liquid crystal display panel are provided. The measuring method includes disposing a test electrode on an outside of the liquid crystal display panel, and electrically connecting the test electrode with a pixel electrode, and measuring a voltage of the pixel electrode by the test electrode when the liquid crystal display panel is in operation. The voltage of the pixel electrode can be directly measured by the measuring method, thereby increasing the accuracy for measuring the driving voltage of liquid crystal.

7 Claims, 4 Drawing Sheets

(51) Int. Cl.
*H01L 21/66* (2006.01)
*G02F 1/1343* (2006.01)
*G02F 1/1368* (2006.01)
*G02F 1/13* (2006.01)

(52) U.S. Cl.
CPC .......... *G02F 1/13439* (2013.01); *H01L 22/32* (2013.01); *H01L 27/3248* (2013.01); *G02F 2001/136254* (2013.01); *G02F 2201/123* (2013.01)

(56) References Cited

U.S. PATENT DOCUMENTS

| | | |
|---|---|---|
| 2007/0194348 A1 | 8/2007 | Yang et al. |
| 2014/0002090 A1 | 1/2014 | Wu et al. |
| 2014/0111724 A1 | 4/2014 | Nishino et al. |

FOREIGN PATENT DOCUMENTS

| | | |
|---|---|---|
| CN | 101697052 A | 4/2010 |
| CN | 101770122 A | 7/2010 |

\* cited by examiner

FIG. 4

MEASURING METHOD AND LIQUID CRYSTAL DISPLAY PANEL

FIELD OF THE INVENTION

The present invention relates to the field of liquid crystal display devices, and more particularly to a measuring method and a liquid crystal display panel.

BACKGROUND OF THE INVENTION

A liquid crystal display panel is sealed after it is completed, so that a driving voltage of liquid crystal can be measured only by indirect methods. One of the measuring methods is to measure optical quantum, such as measuring brightness to obtain a light transmittance, so as to obtain a voltage according to the corresponding relationship between the voltage and the optical quantum. For example, it can be speculated according to the relationship between the voltage and the light transmittance.

It can be seen that in the conventional measuring method, the driving voltage of liquid crystal cannot be directly measured and the driving voltage of liquid crystal cannot be monitored in real time when the liquid crystal display panel is in operation, so that the measured driving voltage of liquid crystal is incorrect, and some problems in the liquid crystal display panel cannot be correctly solved.

Accordingly, it is necessary to provide a measuring method to solve the technical problem in the prior art.

SUMMARY OF THE INVENTION

An object of the present invention is to provide a measuring method and a liquid crystal display panel so as to solve the technical problem that when the liquid crystal display panel is in operation, a driving voltage of liquid crystal cannot be directly measured.

In order to solve the above-mentioned problems, the technical solution of the present invention is as follows:

In an embodiment, the present invention provides a measuring method for a liquid crystal display panel.

The liquid crystal display panel comprises an array substrate.

The array substrate comprises a plurality of data lines, a plurality of scan lines, and pixel units.

The plurality of data lines are used for transmitting data signals.

The plurality of scan lines are used for transmitting scan signals.

The pixel units are constituted by the plurality of data lines and the plurality of scan lines which are interlaced, and an image is displayed according to the scan signals and the data signals.

The pixel unit comprises a thin film transistor and a pixel electrode.

The thin film transistor is used for transmitting the data signals to the pixel electrode according to the scan signals.

The measuring method comprises the following steps:

disposing a test electrode on an outside of the liquid crystal display panel;

disposing a trace on a metal layer of the array substrate;

electrically connecting the test electrode with the trace, and electrically connecting the pixel electrode with the trace;

disposing a connecting line in the liquid crystal display panel;

electrically connecting the test electrode with the trace by using the connecting line;

supplying the liquid crystal display panel with power so as to make it operate; and measuring a voltage of the pixel electrode by using the test electrode.

In the measuring method of the present invention, the array substrate comprises the metal layer, a transparent electrode layer, and a middle layer therebetween. The pixel electrode layer comprises the pixel electrode.

The trace on the metal layer has a first preliminary welded region. There is a second preliminary welded region corresponding the first preliminary welded region on the pixel electrode.

The step of electrically connecting the pixel electrode and the trace comprises:

irradiating the second preliminary welded region with a laser so as to heat up the second preliminary welded region and to melt the pixel electrode in the second preliminary welded region; and melting, with heat transferred from the pixel electrode which is melted, a region of the middle layer which corresponds to the first preliminary welded region, so that the pixel electrode which is melted passes through the region of the middle layer and contacts the first preliminary welded region, thereby achieving that the first preliminary welded region is electrically connected with the pixel electrode which is unmelted.

In the measuring method of the present invention, the array substrate comprises:

A substrate;

A first metal layer, disposed on the substrate and comprising a gate of the thin film transistor and the plurality of scan lines;

A gate insulating layer, disposed on the first metal layer;

A semiconductor layer, disposed on the gate insulating layer and used for forming a channel of the thin film transistor;

A second metal layer, disposed on the semiconductor layer and comprising a source of the thin film transistor, a drain of the thin film transistor, and the plurality of data lines;

An insulating layer, disposed on the second metal layer; and

A transparent electrode layer, disposed on the gate insulating layer and the insulating layer and comprising the pixel electrode which is electrically connected with the drain.

The metal layer is the first metal layer, and the middle layer comprises the gate insulating layer and/or the insulating layer.

In the measuring method of the present invention, the array substrate comprises:

A substrate;

A first metal layer, disposed on the substrate and comprising a gate of the thin film transistor and the plurality of scan lines;

A gate insulating layer, disposed on the first metal layer;

A semiconductor layer, disposed on the gate insulating layer and used for forming a channel of the thin film transistor;

A second metal layer, disposed on the semiconductor layer and comprising a source of the thin film transistor, a drain of the thin film transistor, and the plurality of data lines;

An insulating layer, disposed on the second metal layer; and

A transparent electrode layer, disposed on the gate insulating layer and the insulating layer and comprising the pixel electrode which is electrically connected with the drain.

The metal layer is the second metal layer, and the middle layer is the insulating layer.

In another embodiment, the present invention also provides another measuring method for a liquid crystal display panel.

The liquid crystal display panel comprises an array substrate.

The array substrate comprises a plurality of data lines, a plurality of scan lines, and pixel units.

The plurality of data lines are used for transmitting data signals.

The plurality of scan lines are used for transmitting scan signals.

The pixel units are constituted by the plurality of data lines and the plurality of scan lines which are interlaced, and an image is displayed according to the scan signals and the data signals.

The pixel unit comprises a thin film transistor and a pixel electrode.

The thin film transistor is used for transmitting the data signals to the pixel electrode according to the scan signals.

The measuring method comprises the following steps:

disposing a test electrode on an outside of the liquid crystal display panel;

electrically connecting the test electrode with the pixel electrode;

supplying the liquid crystal display panel with power so as to make it operate; and measuring a voltage of the pixel electrode by using the test electrode.

In the measuring method of the present invention, the step of electrically connecting the test electrode with the pixel electrode comprises:

disposing a trace on a metal layer of the array substrate; and electrically connecting the test electrode with the trace, and electrically connecting the pixel electrode with the trace.

In the measuring method of the present invention, the array substrate comprises the metal layer, a transparent electrode layer, and a middle layer therebetween. The pixel electrode layer comprises the pixel electrode.

The trace on the metal layer has a first preliminary welded region. There is a second preliminary welded region corresponding the first preliminary welded region on the pixel electrode.

The step of electrically connecting the pixel electrode and the trace comprises:

irradiating the second preliminary welded region with a laser so as to heat up the second preliminary welded region and to melt the pixel electrode in the second preliminary welded region;

melting, with heat transferred from the pixel electrode which is melted, a region of the middle layer which corresponds to the first preliminary welded region, so that the pixel electrode which is melted passes through the region of the middle layer and contacts the first preliminary welded region, thereby achieving that the first preliminary welded region is electrically connected with the pixel electrode which is unmelted.

In the measuring method of the present invention, the array substrate comprises:

A substrate;

A first metal layer, disposed on the substrate and comprising a gate of the thin film transistor and the plurality of scan lines;

A gate insulating layer, disposed on the first metal layer;

A semiconductor layer, disposed on the gate insulating layer and used for forming a channel of the thin film transistor;

A second metal layer, disposed on the semiconductor layer and comprising a source of the thin film transistor, a drain of the thin film transistor, and the plurality of data lines;

An insulating layer, disposed on the second metal layer; and

A transparent electrode layer, disposed on the gate insulating layer and the insulating layer and comprising the pixel electrode which is electrically connected with the drain.

The metal layer is the first metal layer, and the middle layer comprises the gate insulating layer and/or the insulating layer.

In the measuring method of the present invention, the array substrate comprises:

A substrate;

A first metal layer, disposed on the substrate and comprising a gate of the thin film transistor and the plurality of scan lines;

A gate insulating layer, disposed on the first metal layer;

A semiconductor layer, disposed on the gate insulating layer and used for forming a channel of the thin film transistor;

A second metal layer, disposed on the semiconductor layer and comprising a source of the thin film transistor, a drain of the thin film transistor, and the plurality of data lines;

An insulating layer, disposed on the second metal layer; and

A transparent electrode layer, disposed on the gate insulating layer and the insulating layer and comprising the pixel electrode which is electrically connected with the drain.

The metal layer is the second metal layer, and the middle layer is the insulating layer.

In the measuring method of the present invention, the step of electrically connecting the test electrode with the trace comprises:

disposing a connecting line in the liquid crystal display panel; and electrically connecting the test electrode with the trace by using the connecting line.

In the measuring method of the present invention, the step of electrically connecting the pixel electrode with the trace comprises:

electrically connecting the pixel electrode with the trace by using a bridging line.

In the measuring method of the present invention, the array substrate comprises the metal layer, a transparent electrode layer, and a middle layer therebetween. The pixel electrode layer comprises the pixel electrode.

The middle layer is provided with a bridging hole.

The step of electrically connecting the pixel electrode with the trace comprises:

electrically connecting the pixel electrode with the trace by using the bridging hole of the middle layer.

In another embodiment, the present invention also provides a liquid crystal display panel comprising an array substrate and a test electrode.

The array substrate comprises a plurality of data lines, a plurality of scan lines, and pixel units.

The plurality of data lines are used for transmitting data signals.

The plurality of scan lines are used for transmitting scan signals.

The pixel units are constituted by the plurality of data lines and the plurality of scan lines which are interlaced, and an image is displayed according to the scan signals and the data signals.

The pixel unit comprises a thin film transistor and a pixel electrode.

The thin film transistor is used for transmitting the data signals to the pixel electrode according to the scan signals.

The test electrode is disposed on an outside of the liquid crystal display panel and connected with the pixel electrode for measuring a voltage of the pixel electrode.

In the liquid crystal display panel of the present invention, which comprises a connecting circuit disposed in the liquid crystal display panel.

The test electrode is electrically connected with the pixel electrode by using the connecting circuit.

The connecting circuit comprises a trace on the metal layer of the array substrate.

In the liquid crystal display panel of the present invention, the array substrate comprises:

A substrate;

A first metal layer, disposed on the substrate and comprising a gate of the thin film transistor and the plurality of scan lines;

A gate insulating layer, disposed on the first metal layer;

A semiconductor layer, disposed on the gate insulating layer and used for forming a channel of the thin film transistor;

A second metal layer, disposed on the semiconductor layer and comprising a source of the thin film transistor, a drain of the thin film transistor, and the plurality of data lines;

An insulating layer, disposed on the second metal layer; and

A transparent electrode layer is disposed on the gate insulating layer and the insulating layer and comprises the pixel electrode which is electrically connected with the drain.

The trace on the metal layer is a trace on the first metal layer.

In the liquid crystal display panel of the present invention, the array substrate comprises:

A substrate;

A first metal layer, disposed on the substrate and comprising a gate of the thin film transistor and the plurality of scan lines;

A gate insulating layer, disposed on the first metal layer;

A semiconductor layer, disposed on the gate insulating layer and used for forming a channel of the thin film transistor;

A second metal layer, disposed on the semiconductor layer and comprising a source of the thin film transistor, a drain of the thin film transistor, and the plurality of data lines;

An insulating layer, disposed on the second metal layer; and

A transparent electrode layer, disposed on the gate insulating layer and the insulating layer and comprising the pixel electrode which is electrically connected with the drain.

The trace on the metal layer is a trace on the second metal layer.

In the liquid crystal display panel of the present invention, the test electrode is directly electrically connected with the trace, and the trace is electrically connected with the pixel electrode.

In the liquid crystal display panel of the present invention, the connecting circuit comprises a bridging line, and the trace is electrically connected with the pixel electrode by using the bridging line.

In the liquid crystal display panel of the present invention, the array substrate comprises the metal layer, a transparent electrode layer, and a middle layer therebetween. The pixel electrode layer comprises the pixel electrode.

The connecting circuit further comprises a bridging hole which is disposed on the pixel electrode layer.

The trace passes through the bridging hole of the middle layer and the pixel electrode.

In the liquid crystal display panel of the present invention, the connecting circuit further comprises a connecting line.

The test electrode is electrically connected with the trace by the connecting line.

The trace is electrically connected with the pixel electrode.

The present invention provides a measuring method and a liquid crystal display panel. The measuring method of the present invention comprises: disposing a test electrode on an outside of the liquid crystal display panel; electrically connecting the test electrode with a pixel electrode; supplying the liquid crystal display panel with power so as to make it operate; and measuring a voltage of the pixel electrode by using the test electrode. According to the above-mentioned solutions, a measurement electrode electrically connected with the pixel electrode is disposed on the outside of the liquid crystal display panel. After the liquid crystal display panel is completed, a skilled person can directly measure the voltage of the pixel electrode (i.e., a driving voltage of liquid crystal) by the measurement electrode. By using the measuring method and the liquid crystal display panel of the present invention, the driving voltage of liquid crystal can be monitored in real time when the liquid crystal display panel is in operation, thereby increasing the accuracy for measuring the driving voltage of liquid crystal, and some problems in the liquid crystal display panel can be correctly solved.

DETAILED DESCRIPTION OF THE INVENTION

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In this embodiment, a liquid crystal display panel is provided, comprising an array substrate 20 and a test electrode 10.

The array substrate 20 comprises a plurality of data lines 201, a plurality of scan lines 202, and pixel units 203.

The data line 201 is used for transmitting data signals.

The scan line 202 is used for transmitting scan signals.

The pixel unit 203 is constituted by the data line and the scan line which are interlaced, and an image is displayed according to the scan signals and the data signals.

The pixel unit 203 comprises a thin film transistor 2031 and a pixel electrode 2032.

The thin film transistor 2031 is used for transmitting the data signals to the pixel electrode 2032 according to the scan signals.

The thin film transistor 2031 comprises a source 2031a, a gate 2031b, and a drain 2031c. The source 2031a is connected with the data line 201 for receiving the data signals. The gate 2031b is connected with the can line 202 for receiving the scan signals. The drain 2031c is connected with the pixel electrode 2032.

The test electrode 10 is disposed on an outside of the liquid crystal display panel and connected with the pixel electrode 2032 for measuring a voltage of the pixel unit 203.

To be specific, the test electrode 10 is electrically connected with the pixel electrode 2032 by a circuit in the liquid crystal display panel.

In this embodiment, the test electrode 10 can be disposed on the outside of the liquid crystal display panel. If the integrality and assembly convenience of the liquid crystal display panel are taken in account, the test electrode 10 of this embodiment can be disposed on a side of the liquid crystal display panel. In the meanwhile, the test electrode of this embodiment can serve as a metal contact point.

By using the liquid crystal display panel of this embodiment, a voltage of the pixel electrode 2032 can be measured. The specific measuring method is as follows:

Supplying the liquid crystal display panel with power so as to make it operate.

Connecting the test electrode 10 with a measuring equipment. The voltage of the pixel electrode 2032 is measured by the test electrode 10.

In this embodiment, there are a plurality of circuits. That is, the test electrode 10 and the pixel electrode 2032 can be electrically connected by a plurality of connection methods.

In order to reduce cost and conveniently connect, the circuit of this embodiment can comprise a trace on a metal layer (first metal layer or second metal layer) of the array substrate 20. To be specific, the test electrode 10 can be electrically connected with the trace, and the trace can be electrically connected with the pixel electrode 2032, thereby achieving an object that the test electrode 10 is electrically connected with the pixel electrode 2032.

In this embodiment, the trace of the circuit means that a part of or the entirety of the circuit located between the test electrode 10 and the pixel electrode 2032 serves as the trace on the metal layer.

Figure 1:
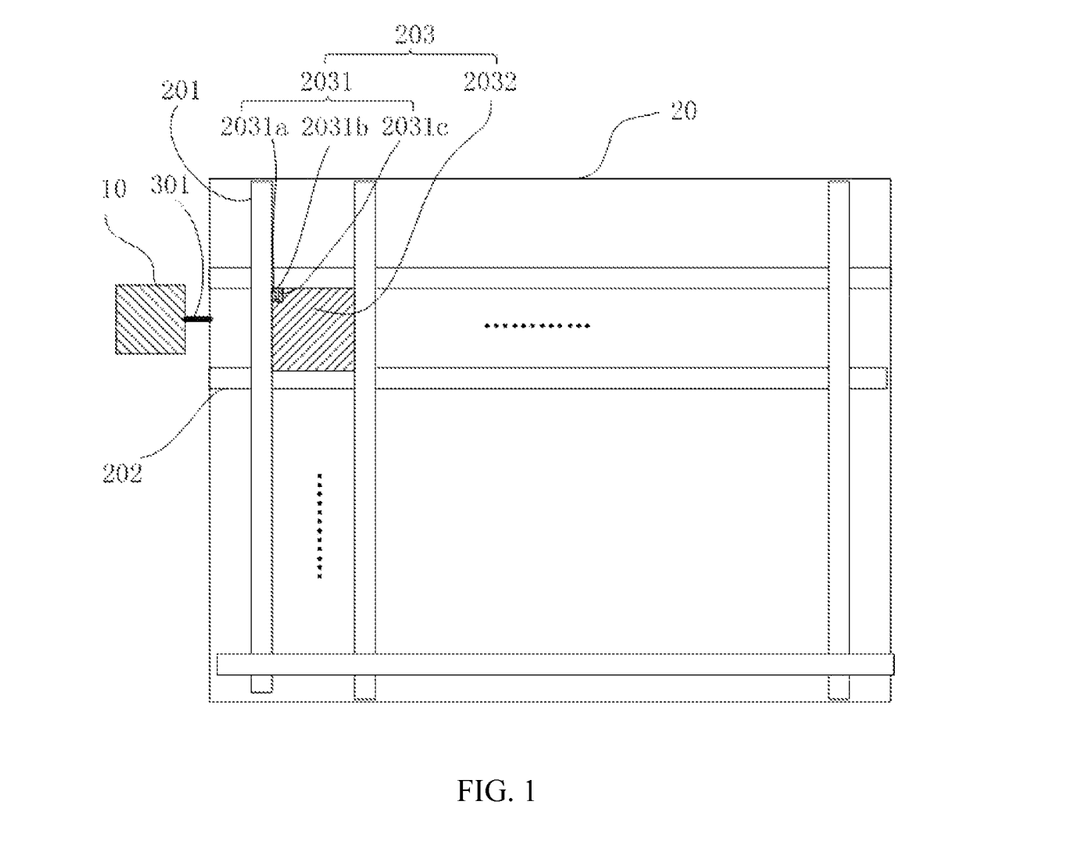
FIG. 1 is a diagram showing a connection embodiment of a test electrode and a pixel electrode of the present invention.

As shown on FIG. 1, the circuit comprises a connecting line 301 and a trace (not shown on FIG. 1) on the metal layer of the array substrate 20. The test electrode 10 is electrically connected with the connecting line 301. The connecting line 301 is electrically connected with the trace on the metal layer of the array substrate 20. The trace is also electrically connected with the pixel electrode 2032, thereby achieving an object that the test electrode 10 is electrically connected with the pixel electrode 2032. In this embodiment, the test electrode 10 can be electrically connected with the pixel electrode 2032 by the trace of the metal layer.

Preferably, in this embodiment, the array substrate comprises the metal layer (such as a first metal layer or a second metal layer), a middle layer (such as an insulating layer), and a transparent electrode layer. The middle layer is located between the metal layer and the transparent electrode layer. The transparent electrode layer is located above the metal layer and comprises a pixel electrode. In this embodiment, in order to electrically connect the trace on the metal layer with the pixel electrode 2032 on a top layer, a bridging line or a bridging hole can be utilized. The trace is electrically connected with the pixel electrode 2032 by using the bridging line or the bridging hole on the middle layer.

Figure 2:
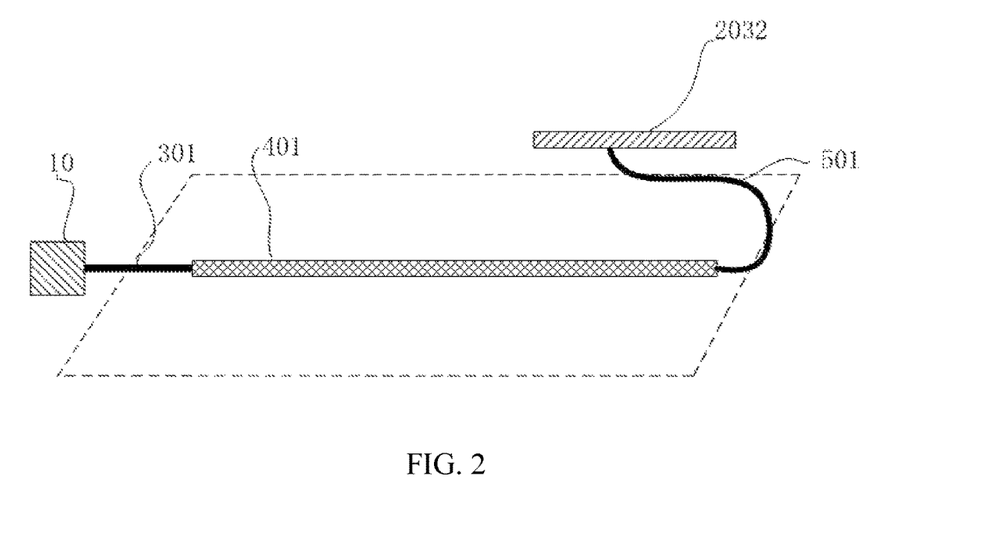
FIG. 2 is a diagram showing another connection embodiment of a test electrode and a pixel electrode of the present invention.

According to the above description, as shown in FIG. 2 is a diagram showing a connection embodiment of the test electrode 10 and the pixel electrode 2032. In FIG. 2, the circuit may comprise the connecting line 301, a trace 401 on the metal layer (such as the first metal layer or the second metal layer) of the array substrate 20, and a bridging line 501. The test electrode 10 is electrically connected with the trace 401 on the metal layer by the connecting line 301. The trace 401 on the metal layer is electrically connected with the pixel electrode 2032 by the bridging line.

Figure 3:
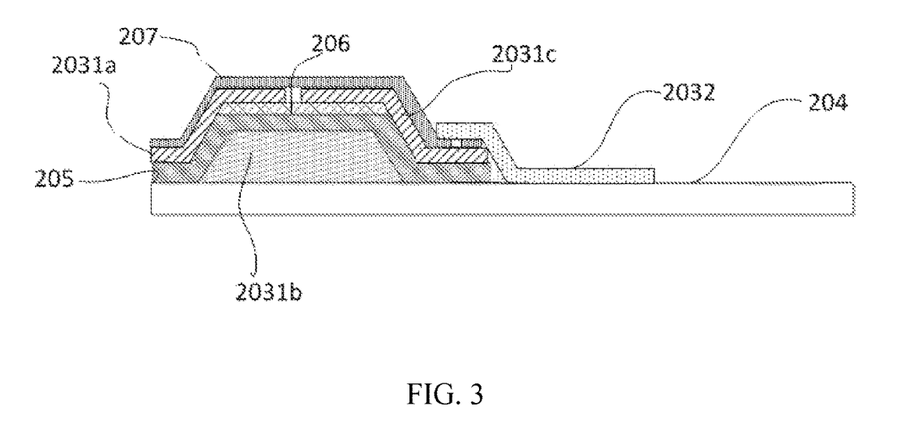
FIG. 3 is a structure diagram of an array substrate of an embodiment of the present invention.

As shown on FIG. 3, in this embodiment, the array substrate 20 can comprise:

The array substrate comprises:

A substrate 204;

A first metal layer, disposed on the substrate 204 and comprising the gate 2031b of the thin film transistor and the plurality of scan lines 202;

A gate insulating layer 205, disposed on the first metal layer;

A semiconductor layer 206, disposed on the gate insulating layer 205 and used for forming a channel of the thin film transistor 2031;

The second metal layer, disposed on the semiconductor layer 206 and comprising the source 2031a of the thin film transistor 2031, the drain 2031c of the thin film transistor 2031, and the plurality of data lines 201;

An insulating layer 207, disposed on the second metal layer; and

A transparent electrode layer, disposed on the gate insulating layer 205 and the insulating layer 207 and comprising the pixel electrode 2032 which is electrically connected with the drain 2031c.

The trace 401 of this embodiment can be the trace on the first metal layer (M1). The test electrode 10 is electrically connected with the trace on the M1 by the connecting line 301. The trace on the M1 is electrically connected with the pixel electrode 2032 by the bridging line 501 or the bridging hole.

The trace 401 of this embodiment can also be the trace on the second metal layer (M2). The test electrode 10 is electrically connected with the trace on the M2 by the connecting line 301. The trace on the M2 is electrically connected with the pixel electrode 2032 by the bridging line 501 or the bridging hole.

In order to simplify the electrical connection between the trace on the metal layer and the pixel electrode on the top layer, the issue that image display of the liquid crystal display panel in a normal operation will be influenced if the test electrode 10 keeps electrically connecting with pixel electrode 2032 should be taken into account. For the above-mentioned issue, the trace is welded to the pixel electrode when a measurement is required, so that the pixel electrode 2032 on the top layer is electrically connected with the trace on the metal layer. When the measurement is not required, the trace is unwelded from the pixel electrode, so that they are not conducting.

Figure 4:
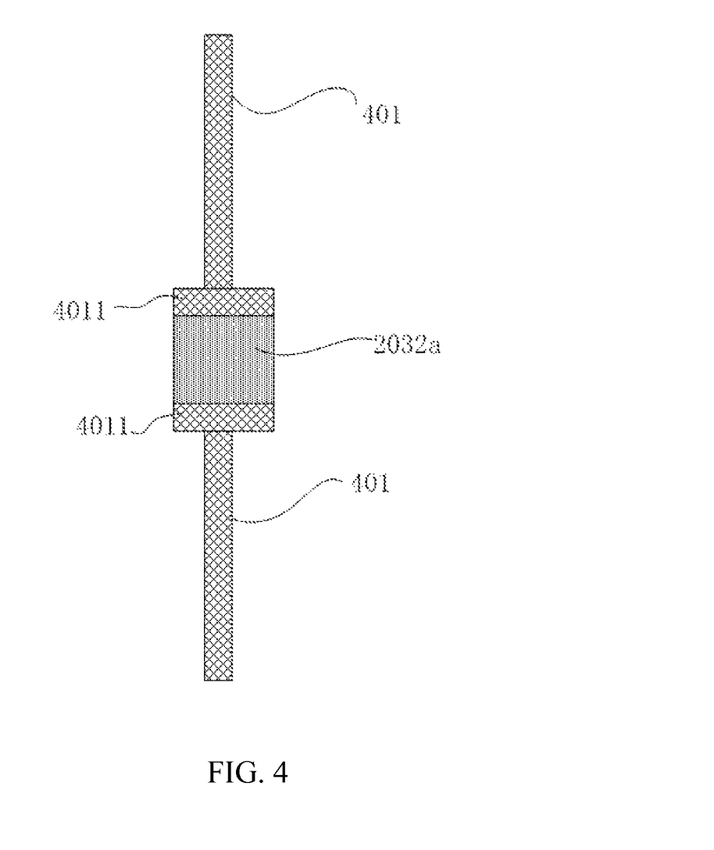
FIG. 4 is a diagram showing a trace being welded with the pixel electrode of an embodiment of the present invention.

To be specific, refer to FIG. 4 (using the trace 401 on the M1 as an example), the trace 401 on the M1 has a first preliminary welded region 4011. The middle layer (not shown) located between the M1 layer and the pixel electrode 2032 comprises a gate insulating layer 205 and the insulating layer 207. There is a second preliminary welded region 2032a corresponding to the first preliminary welded region 4011 on the pixel electrode 2032. The second preliminary welded region 2032a can be a projection area of the first preliminary welded region 4011 onto the pixel electrode 2032.

The specific processes of the pixel electrode 2032 being electrically connected with the trace 401 comprise:

Irradiating the second preliminary welded region 2032a with a laser so as to heat up the second preliminary welded region 2032a and to melt the pixel electrode 2032 in the second preliminary welded region 2032a; and Melting, with heat transferred from the pixel electrode which is melted, a region of the middle layer (specifically comprising: the gate insulating layer 205 and/or the insulating layer 207) which corresponds to the first preliminary welded region 4011, so that the pixel electrode which is melted passes through the region of the middle layer (passing through the gate insulating layer 205 and/or the insulating layer 207) and contacts the first preliminary welded region 4011, thereby achieving that the first preliminary welded region 4011 is electrically connected with the pixel electrode 2032 which is unmelted.

In the structure shown on FIG. 4, the trace 401 is electricity conducting only when the welded region is welded. By this structure, an electrode on outside of the panel is electrically isolated from an electrode on the pixels. It is electricity conducting by welding only when the measurement is required.

Similarly, the trace on the metal layer is the trace on the M2. When the middle layer is the insulating layer, the processes of welding the pixel electrode 2032 and the trace on the M2 is similar to the processes of welding the pixel electrode 2032 and the trace on the M1 as described above, and a repeated explanation is omitted here.

By using the liquid crystal display panel of this embodiment, the driving voltage of liquid crystal can be measured, and the driving voltage of liquid crystal can be monitored in real time when the liquid crystal display panel is in operation, thereby increasing the accuracy for measuring the driving voltage of liquid crystal, and providing strong evidence for some problems in the liquid crystal display panel.

The above descriptions are merely preferable embodiments of the present invention, but are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A liquid crystal display panel comprising an array substrate and a test electrode, the array substrate comprising:
   a plurality of data lines, a plurality of scan lines, and pixel units;
   wherein the plurality of data lines are used for transmitting data signals;
   the plurality of scan lines are used for transmitting scan signals;
   the pixel units are constituted by the plurality of data lines and the plurality of scan lines which are interlaced, and an image is displayed according to the scan signals and the data signals;
   the pixel unit comprises a thin film transistor and a pixel electrode;
   the thin film transistor is used for transmitting the data signals to the pixel electrode according to the scan signals;
   the test electrode is disposed on an outside of the liquid crystal display panel for measuring a voltage of the pixel electrode;
   a connecting circuit configured to connect the test electrode with the pixel electrode, wherein the connecting circuit comprises a trace on a metal layer of the array substrate;
   a first preliminary welded region formed on the trace on the metal layer;
   a second preliminary welded region formed on the pixel electrode, wherein position of the first preliminary welded region on the trace corresponds to position of the second preliminary welded region on the pixel electrode; and
   a middle layer disposed between the first preliminary welded region and the second preliminary welded region and configured to electrically insulate the trace from the pixel electrode.

2. The liquid crystal display panel as claimed in claim 1, wherein the array substrate comprises:
   a substrate;
   a first metal layer, disposed on the substrate and comprising a gate of the thin film transistor and the plurality of scan lines;
   a gate insulating layer, disposed on the first metal layer;
   a semiconductor layer, disposed on the gate insulating layer and used for forming a channel of the thin film transistor;
   a second metal layer, disposed on the semiconductor layer and comprising a source of the thin film transistor, a drain of the thin film transistor, and the plurality of data lines;
   an insulating layer, disposed on the second metal layer; and
   a transparent electrode layer, disposed on the gate insulating layer and the insulating layer and comprising the pixel electrode which is electrically connected with the drain; and
   wherein the trace on the metal layer is a trace on the first metal layer.

3. The liquid crystal display panel as claimed in claim 1, wherein the array substrate comprises:
   a substrate;
   a first metal layer, disposed on the substrate and comprising a gate of the thin film transistor and the plurality of scan lines;
   a gate insulating layer, disposed on the first metal layer;
   a semiconductor layer disposed on the gate insulating layer and used for forming a channel of the thin film transistor;
   a second metal layer, disposed on the semiconductor layer and comprising a source of the thin film transistor, a drain of the thin film transistor, and the plurality of data lines;
   an insulating layer, disposed on the second metal layer; and a transparent electrode layer, disposed on the gate insulating layer and the insulating layer and comprising the pixel electrode which is electrically connected with the drain; and wherein the trace on the metal layer is a trace on the second metal layer.

4. The liquid crystal display panel as claimed in claim 1, wherein the test electrode is directly electrically connected with the trace, and the trace is electrically connected with the pixel electrode.

5. The liquid crystal display panel as claimed in claim 4, wherein the connecting circuit comprises a bridging line, and the trace is electrically connected with the pixel electrode by using the bridging line.

6. The liquid crystal display panel as claimed in claim 4, wherein the array substrate comprises the metal layer, a transparent electrode layer, and the middle layer therebetween, the pixel electrode layer comprises the pixel electrode;

the connecting circuit further comprises a bridging hole which is disposed on the pixel electrode layer; and the trace passes through the bridging hole of the middle layer and the pixel electrode.

7. The liquid crystal display panel as claimed in claim 1, wherein the connecting circuit further comprises a connecting line;

the test electrode is electrically connected with the trace by the connecting line; and the trace is electrically connected with the pixel electrode.

\* \* \* \* \*